(12) United States Patent
Im et al.

(10) Patent No.: US 11,210,978 B2
(45) Date of Patent: Dec. 28, 2021

(54) DISPLAY APPARATUS

(71) Applicant: Samsung Display Co., Ltd., Yongin-si (KR)

(72) Inventors: Minhyuk Im, Yongin-si (KR); Kichang Lee, Yongin-si (KR); Yeongbong Kang, Yongin-si (KR); Seongsik Ahn, Yongin-si (KR); Myoungha Jeon, Yongin-si (KR); Sujin Jung, Yongin-si (KR); Sangkyu Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/880,490

(22) Filed: May 21, 2020

(65) Prior Publication Data

US 2021/0118343 A1 Apr. 22, 2021

(30) Foreign Application Priority Data

Oct. 22, 2019 (KR) ........................ 10-2019-0131386

(51) Int. Cl.
*G09G 3/3291* (2016.01)
*G09G 3/00* (2006.01)

(52) U.S. Cl.
CPC ........... *G09G 3/006* (2013.01); *G09G 3/3291* (2013.01); *G09G 2330/08* (2013.01); *G09G 2330/12* (2013.01)

(58) Field of Classification Search
CPC .......... G09G 3/006; G09G 3/03; G09G 3/035; G09G 3/3266–3291; G09G 3/3674–3692; G09G 2300/0421–043; G09G 2310/0264–0283; G09G 2320/04; G09G 2320/043; G09G 2320/045; G09G 2330/08; G09G 2330/12; G09G 2380/02
See application file for complete search history.

(56) References Cited

U.S. PATENT DOCUMENTS 7,096,748 B2   8/2006   Kutlu
10,522,431 B2  12/2019  Kim et al.
(Continued)

FOREIGN PATENT DOCUMENTS

KR   10-2018-0049484   5/2018
KR   10-2018-0064596   6/2018
KR   10-2018-0065061   6/2018

*Primary Examiner* — Nathan Danielsen
(74) *Attorney, Agent, or Firm* — Kile Park Reed & Houtteman PLLC (57) ABSTRACT

A display apparatus includes a substrate including a display area, a non-display area outside the display area, a pad area located in the non-display area, and a bending area between the display area and the pad area. The display apparatus includes a first voltage line having a first main voltage line disposed between the display area and the bending area, and a first connection portion protruding from the first main voltage line, extending toward the pad area, and crossing the bending area. The display apparatus includes a fan-out portion disposed between the display area and the pad area on the substrate and including conductive lines that connect the display area to the pad area, and a strain gauge disposed in the bending area. The strain gauge overlaps the first connection portion of the first voltage line in the bending area.

20 Claims, 8 Drawing Sheets

(56) References Cited

U.S. PATENT DOCUMENTS

| | | |
|---|---|---|
| 10,522,608 B2 | 12/2019 | Park et al. |
| 2015/0296607 A1 | 10/2015 | Yang et al. |
| 2017/0288008 A1* | 10/2017 | Kim ................... G09G 3/3266 |
| 2018/0053466 A1* | 2/2018 | Zhang ..................... G09G 3/20 |
| 2018/0122863 A1 | 5/2018 | Bok |
| 2018/0158741 A1 | 6/2018 | Kim et al. |
| 2018/0158894 A1 | 6/2018 | Park et al. |
| 2019/0074332 A1 | 3/2019 | Kim et al. |
| 2019/0123126 A1* | 4/2019 | Song ................... G09G 3/3266 |
| 2020/0035204 A1* | 1/2020 | Wu ....................... G06F 1/1601 |

* cited by examiner

DISPLAY APPARATUS

CROSS-REFERENCE TO RELATED APPLICATION

This application claims priority to and benefits of Korean Patent Application No. 10-2019-0131386 under 35 U.S.C. § 119, filed in the Korean Intellectual Property Office on Oct. 22, 2019, the entire contents of which are incorporated herein by reference.

BACKGROUND

1. Technical Field

One or more embodiments relate to a display apparatus capable of more accurately determining stress generated during bending.

2. Description of Related Art

With the rapid development of the display field for visually expressing various electrical signal information, various flat display apparatuses having excellent characteristics such as slimness, light weight, and low power consumption have been introduced. Recently, display apparatuses in which physical buttons and the like are removed from the front surfaces of the display apparatuses and in which image display areas are expanded have been introduced.

A display area of a display apparatus observable from a front side may be expanded by bending at least a part of the display apparatus.

Stress generated by bending may cause defects in the display apparatus, and in case stress applied to a bending area may be close to a threshold value, it is highly likely that defects will occur in the display apparatus. However, since the display apparatus may still operate normally under such stress, it may be difficult to detect these limitations in advance of such defects.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may include a display apparatus capable of more accurately determining stress generated during bending to prevent defects from occurring in the display apparatus.

Additional aspects will be set forth in part in the description which follows and, in part, will be apparent from the description, or may be learned by practice of the presented embodiments of the disclosure.

According to one or more embodiments, a display apparatus may include a substrate including a display area, a non-display area outside the display area, a pad area in the non-display area, and a bending area between the display area and the pad area, a first voltage line including, a first main voltage line disposed between the display area and the bending area, and a first connection portion protruding from the first main voltage line, extending toward the pad area, and crossing the bending area, a fan-out portion disposed between the display area and the pad area on the substrate and including conductive lines that connect the display area to the pad area, and a strain gauge disposed in the bending area, wherein the strain gauge overlaps the first connection portion of the first voltage line in the bending area.

The conductive lines may each include a first area between the display area and the bending area, a second area between the bending area and the pad area, and a connection conductive layer that may electrically connect the first area to the second area and crossing the bending area, wherein the connection conductive layer may include a first connection conductive layer and a second connection conductive layer connected in parallel to each other and overlapping each other.

The second connection conductive layer may be disposed above the first connection conductive layer, the second connection conductive layer and the first connection portion may be disposed on a same layer, and the first connection conductive layer and the strain gauge may be disposed on a same layer.

The first area and the second area may be on a same layer, and the first connection portion may be disposed on a different layer than the first area.

The conductive lines may include a first conductive line and a second conductive line, which are adjacent to each other, and the first area of the first conductive line and the second area of the second conductive line may be disposed on different layers.

The fan-out portion may include a first fan-out portion and a second fan-out portion spaced apart from each other in the bending area, and the first connection portion may be disposed in a spacing area between the first fan-out portion and the second fan-out portion in the bending area.

The strain gauge may include a resistance line having bending portions that may be electrically connected to a driving circuit disposed in the pad area.

The display apparatus may further include a second voltage line that may apply a voltage different from a voltage of the first voltage line to the display area, wherein the second voltage line may include a second connection portion extending in a direction parallel to the first connection portion, the second connection portion and the first connection portion may be disposed on a same layer, and the strain gauge may further overlap the second connection portion in the bending area.

The first connection portion may be disposed between the conductive lines.

An inorganic insulating layer may be disposed on the substrate, wherein the inorganic insulating layer may include a groove at a position corresponding to the bending area, an organic layer may be disposed in the groove, and the first connection portion and the conductive lines may be disposed on the organic layer in the bending area.

According to one or more embodiments, a display apparatus may include a substrate including a display area, a non-display area outside the display area, a pad area in the non-display area, and a bending area between the display area and the pad area, a pair of first strain gauges disposed at sides of the bending area, a fan-out portion disposed between the display area and the pad area on the substrate and including conductive lines that may connect the display area to the pad area, a first voltage line having, a first main voltage line disposed between the display area and the bending area, and a first connection portion protruding from the first main voltage line, extending toward the pad area, and crossing the bending area, a second voltage line that may apply a voltage different from a voltage of the first voltage line to the display area, wherein the second voltage line may include a second connection portion extending in a direction parallel to the first connection portion, and the second connection portion and the first connection portion may be disposed on a same layer, and a second strain gauge disposed in the bending area, wherein the second strain gauge overlaps at least one of the first connection portion or the second connection portion in the bending area.

The fan-out portion may include a first fan-out portion and a second fan-out portion spaced apart from each other in the bending area, and the first connection portion may be disposed in a spacing area between the first fan-out portion and the second fan-out portion in the bending area.

The conductive lines may each include a first area between the display area and the bending area, a second area between the bending area and the pad area, and a connection conductive layer that may electrically connect the first area to the second area and crossing the bending area, wherein the connection conductive layer may include a first connection conductive layer and a second connection conductive layer connected in parallel to each other and overlapping each other.

The second connection conductive layer may be disposed above the first connection conductive layer, the first connection portion, the second connection portion, the pair of the first strain gauges, and the second connection conductive layer may be disposed on a same layer, and the second strain gauge and the first connection conductive layer may be disposed on a same layer.

Pixel circuits, light-emitting devices electrically connected to the pixel circuits, and data lines electrically connected to the pixel circuits may be disposed in the display area, the conductive lines may be electrically connected to the data lines and transfer an electrical signal from a driving circuit disposed in the pad area to the data lines, and the first connection conductive layer and the data lines may be disposed on a same layer.

This display apparatus may further include driving voltage supply lines disposed in the display area, wherein the driving voltage supply lines provide a driving signal to the pixel circuits, and the second connection conductive layer and the driving voltage supply lines may be disposed on a same layer.

The pixel circuits may each may include a storage capacitor including a first storage electrode and a second storage electrode, and the first area, the second area, and either the first storage electrode or the second storage electrode may be disposed on a same layer.

The first area and the second area may be disposed on a same layer, and the first connection portion and the second connection portion may be disposed on a different layer than the first area.

The conductive lines may include a first conductive line and a second conductive line, which are adjacent to each other, and the first area of the first conductive line and the second area of the second conductive line may be disposed on different layers.

An inorganic insulating layer may be disposed on the substrate, wherein the inorganic insulating layer may include a groove at a position corresponding to the bending area, an organic layer may be disposed in the groove, and the first connection portion and the conductive lines may be disposed on the organic layer in the bending area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various elements, these elements should not be limited by these terms. These terms are only used to distinguish one element from another. Similarly, spatially relative terms such as "below", "beneath", "lower", "behind" "above", "upper", or "in front" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, elements positioned "below" or "behind" another device may be placed "above" or "in front" of another device. Accordingly, the illustrative term "below" may include both the lower and upper positions. The device may also be oriented in other directions and thus the spatially relative terms may be interpreted differently depending on the orientations As used herein, the singular forms "a," "an," and "the" are intended to include the plural forms as well, unless the context clearly indicates otherwise.

It will be understood that terms such as "comprise," "include," "has," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of components in the drawings may be exaggerated for convenience of description. In other words, since the sizes and thicknesses of elements in the drawings may be arbitrarily illustrated for convenience of description, the following embodiments are not limited thereto.

Terms such as "overlap" may include layer, stack, face or facing, extending over, covering or partly covering or any other suitable term as would be appreciated and understood by those of ordinary skill in the art. Expressions such as "do not overlap" may include apart from, set aside from, offset from, and any other suitable equivalents as would be appreciated and understood by those of ordinary skill in the art.

Figure 1:
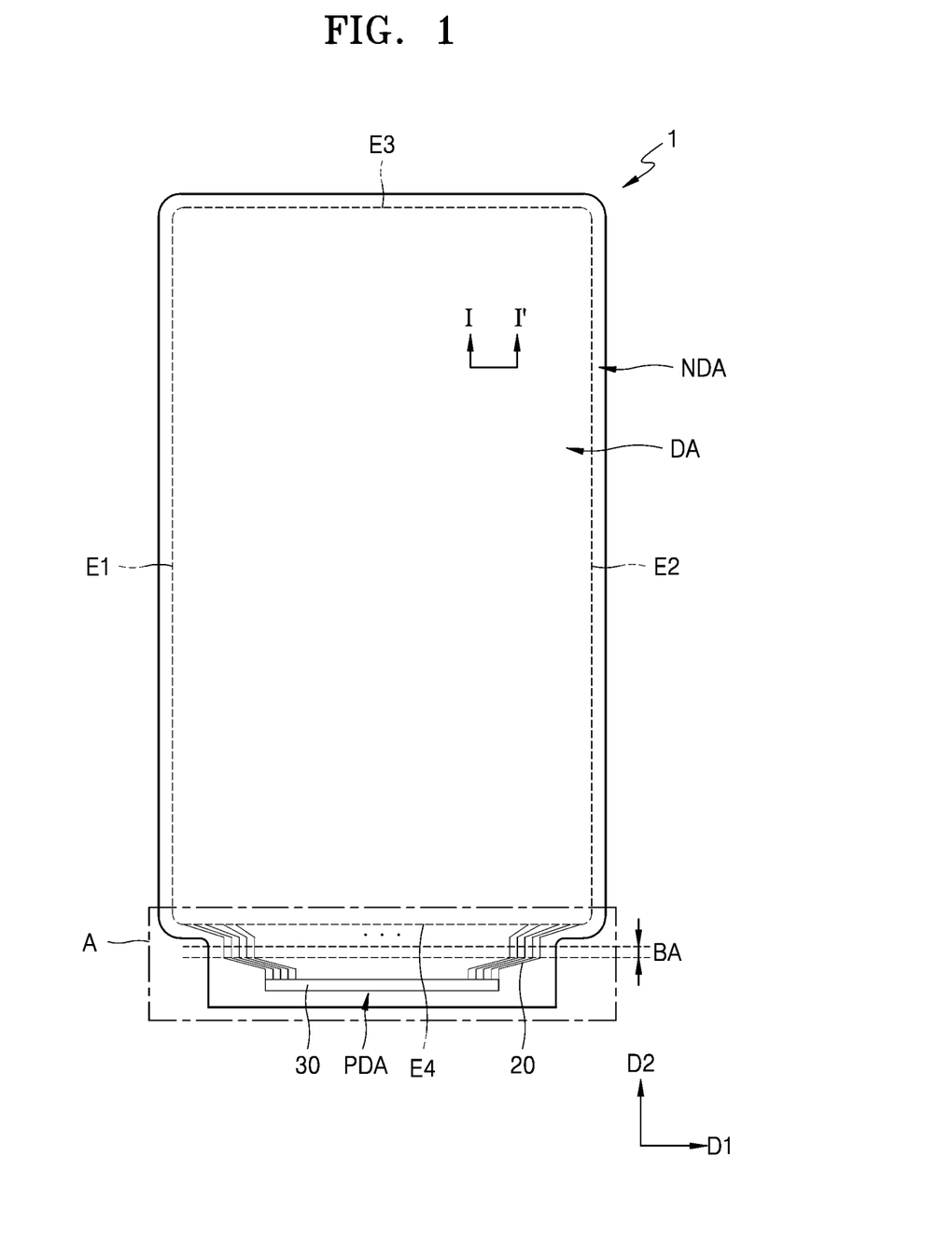
FIG. 1 is a schematic plan view schematically illustrating a display apparatus according to an embodiment.
Figure 2:
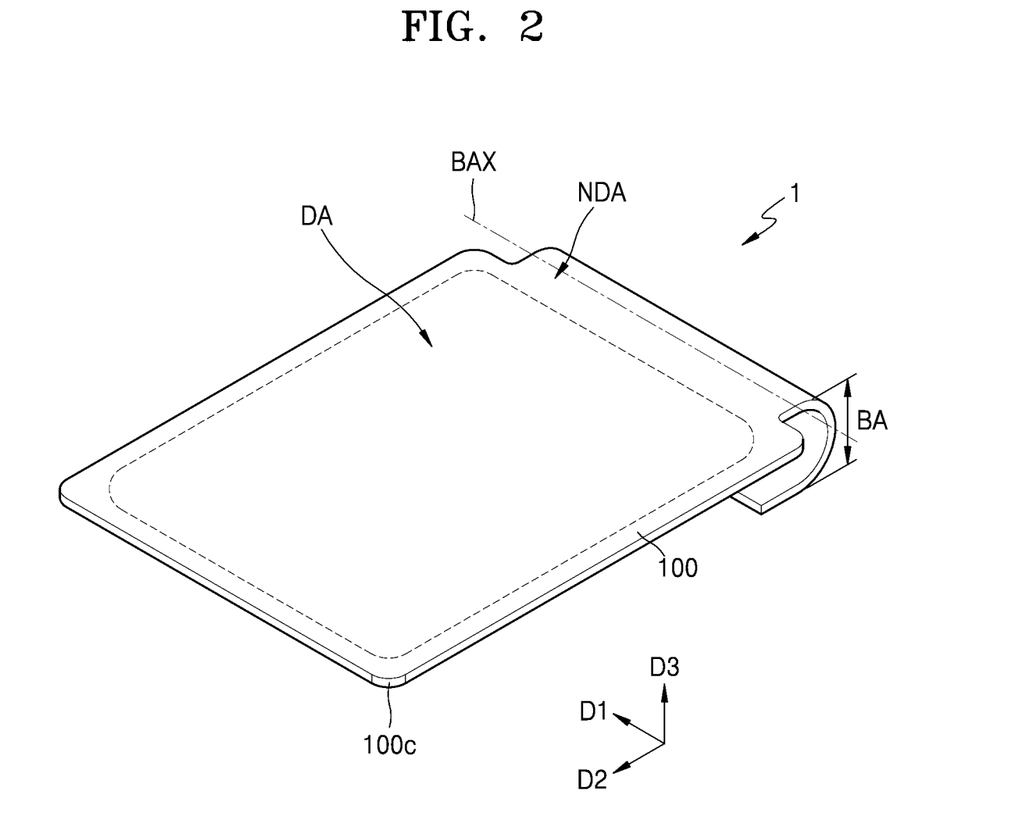
FIG. 2 is a schematic perspective view schematically illustrating a bending shape of the display apparatus of FIG. 1.

FIG. 1 is a schematic plan view schematically illustrating a display apparatus 1 according to an embodiment, and FIG. 2 is a schematic perspective view schematically illustrating a bending shape of the display apparatus 1 of FIG. 1.

Referring to FIGS. 1 and 2, the display apparatus 1 according to the embodiment may include a display area DA in which pixels may be disposed, and a non-display area NDA outside the display area DA. The non-display area NDA may include a pad area PDA, which may be at one side of the display area DA and to which various electronic devices such as integrated circuits (ICs), printed circuit boards, and the like may be attached. The non-display area NDA may include a bending area BA between display area DA and pad area PDA. The display area DA, the non-display area NDA, the pad area PDA, and the bending area BA may be defined on a substrate 100.

FIG. 1 is a plan view illustrating the shape of the substrate 100 and the like during a process of manufacturing the display apparatus 1, and as illustrated in FIG. 2, the substrate 100 may be bent in the bending area BA based on a bending axis BAX extending in a first direction D1. The bending direction may be set such that the pad area PDA may be behind the display area DA in case that the substrate may be bent in the bending area based on the bending axis BAX. Therefore, the area of the non-display area NDA that a user may observe may be minimized.

To this end, the substrate 100 may include various flexible, bendable, or rollable materials. For example, the substrate 100 may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), or a combination thereof. The substrate 100 may have a multi-layered structure that includes two layers each including the above-described polymer resin and a barrier layer disposed between the two layers and including an inorganic material (for example, silicon oxide, silicon nitride, silicon oxynitride, or the like).

Referring to the substrate 100, the width of the non-display area NDA including the bending area BA in the first direction D1 may be less than the width of a portion where the display area DA may be in the first direction dl. A corner portion 100c of an edge of the substrate 100 may have a round shape. Such a shape may also be applied to the display area DA.

For example, the display area DA may have a round shape at corners, wherein the display area DA includes a first edge E1 and a second edge E2 facing each other and a third edge E3 and a fourth edge E4 facing each other and between the first edge E1 and the second edge E2 and thus has a shape similar to a rectangle or a square as a whole. The display area DA may also have a round shape at portions other than the edge.

The pad area PDA may be adjacent to the fourth edge E4 among the first to fourth edges E1 to E4, and a fan-out portion 20 in which conductive lines extend may be disposed in the pad area PDA. The conductive lines may be connected to a driving circuit 30 disposed across the bending area BA. A side of the driving circuit 30 may be electrically connected to a pixel circuit of the display area DA, and the driving circuit 30 may include various electronic devices such as an integrated circuit (IC) at another side.

Figure 3:
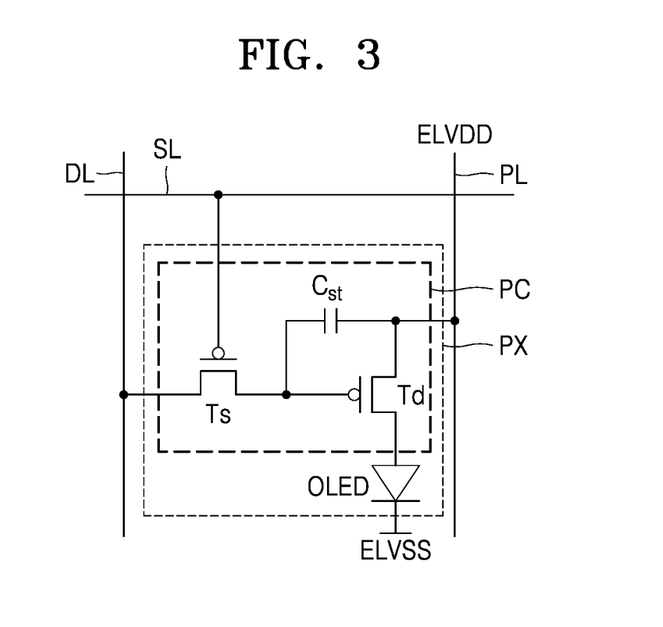
FIG. 3 is a schematic circuit diagram of a pixel of the display apparatus of FIG. 1.
Figure 4:
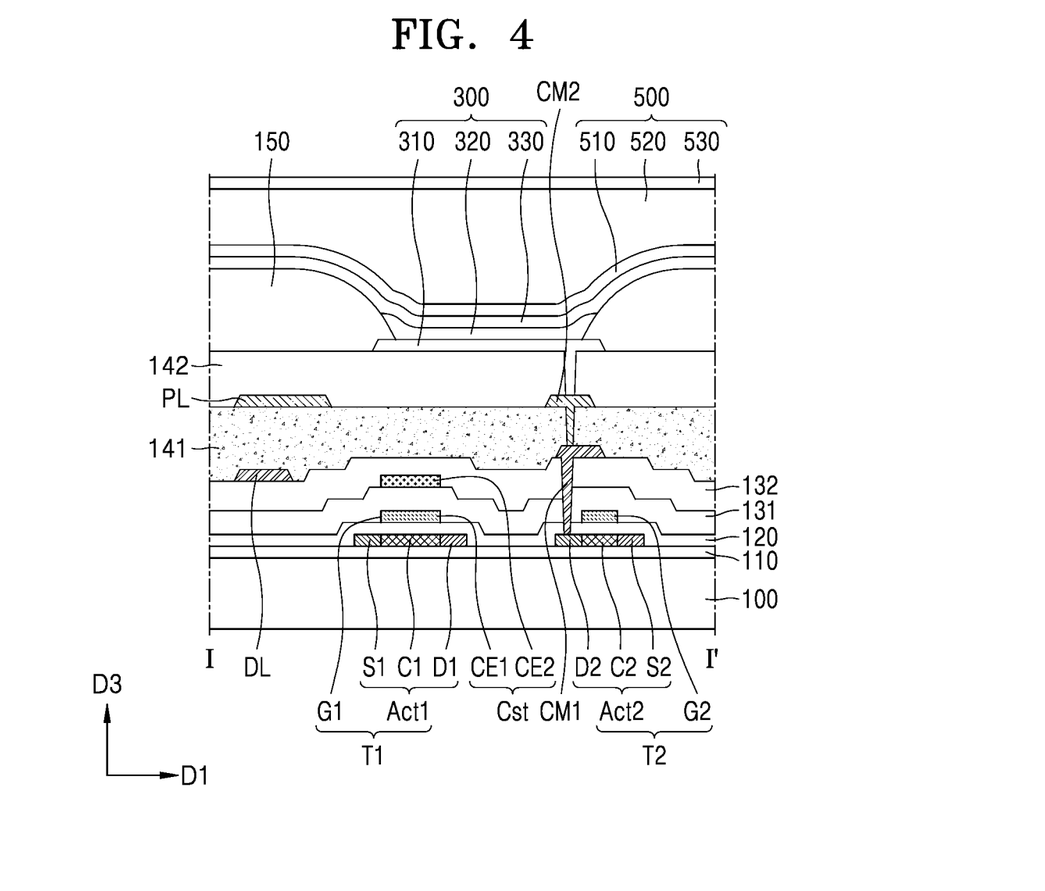
FIG. 4 is a schematic cross-sectional view taken along line I-I' of FIG. 1, according to an embodiment.

FIG. 3 is a schematic circuit diagram of a pixel of the display apparatus 1 of FIG. 1, and FIG. 4 is a schematic cross-sectional view taken along line I-I' of FIG. 1, according to an embodiment.

Referring to FIG. 3, a pixel PX may include a light-emitting device and a pixel circuit PC connected to a scan line SL and a data line DL. The light-emitting device may be an organic light-emitting device OLED.

The pixel circuit PC may include a driving thin-film transistor Td, a switching thin-film transistor Ts, and a storage capacitor Cst.

The switching thin-film transistor Ts may be connected to the scan line SL and the data line DL and may be configured to transfer, to the driving thin-film transistor Td, a data signal input through the data line DL according to a scan signal input through the scan line SL.

The storage capacitor Cst may be connected to the switching thin-film transistor Ts and a driving voltage supply line PL and may be configured to store a voltage corresponding to a difference between a voltage received from the switching thin-film transistor Ts and a driving voltage ELVDD supplied to the driving voltage supply line PL.

The driving thin-film transistor Td may be connected to the driving voltage supply line PL and the storage capacitor Cst and may be configured to control a driving current flowing from the driving voltage supply line PL to the organic light-emitting device OLED according to a voltage value stored in the storage capacitor Cst. The organic light-emitting device OLED may emit light having a certain luminance according to the driving current. The organic light-emitting device OLED may emit, for example, red light, green light, blue light, or white light.

A case in which one pixel PX includes two thin-film transistors (e.g., the switching thin-film transistor Ts and driving thin-film transistor Td), and one storage capacitor Cst has been described above with reference to FIG. 3, but embodiments are not limited thereto. In another embodiment, the pixel circuit PC may be variously changed. For example, the pixel circuit PC may include three or more thin-film transistors or may include two or more storage capacitors.

Hereinafter, the structure of the display apparatus 1 of FIG. 1 will be described in more detail with reference to FIG. 4.

Referring to FIG. 4, a light-emitting device 300 may be electrically connected to first and second thin-film transistors T1 and T2 and a storage capacitor Cst. The light-emitting device 300, the first thin-film transistor T1, the second thin-film transistor T2, and the storage capacitor Cst may correspond to the organic light-emitting device OLED of FIG. 3, the driving thin-film transistor Td of FIG. 3, the switching thin-film transistor Ts of FIG. 3, and the storage capacitor Cst of FIG. 3, respectively.

The first thin-film transistor T1 may include a first semiconductor layer Act1 and a first gate electrode G1, and the second thin-film transistor T2 may include a second semiconductor layer Act2 and a second gate electrode G2.

The first semiconductor layer Act1 and the second semiconductor layer Act2 may each include amorphous silicon, polycrystalline silicon, an oxide semiconductor, or an organic semiconductor. The first semiconductor layer Act1 may include a channel region C1, and a source region S1 and a drain region D1 disposed on both sides of the channel region C1. The second semiconductor layer Act2 may include a channel region C2, and a source region S2 and a drain region D2 disposed on both sides of the channel region C2.

The source regions S1 and S2 and the drain regions D1 and D2 of the first and second semiconductor layers Act1 and Act2 may be understood as source electrodes and drain electrodes of the first and second thin-film transistors T1 and T2, respectively.

The first gate electrode G1 and the second gate electrode G2 may be disposed to overlap the channel region C1 of the first semiconductor layer Act1 and the channel region C2 of the second semiconductor layer Act2, respectively, with a gate insulating layer 120 therebetween. The first gate electrode G1 and the second gate electrode G2 may each be a single film or a multi-layered film including a conductive material including at least one of molybdenum (Mo), aluminum (Al), copper (Cu), or titanium (Ti).

The first gate electrode G1 and the second gate electrode G2 are illustrated in FIG. 4 as being disposed on the same layer, but embodiments are not limited thereto. In another embodiment, the first gate electrode G1 and the second gate electrode G2 may be disposed on different layers. The first gate electrode G1 and the second gate electrode G2 are illustrated in FIG. 4 as a top gate type in which the first gate electrode G1 and the second gate electrode G2 may be respectively disposed above the first semiconductor layer Act1 and the second semiconductor layer Act2, but embodiments are not limited thereto. In another embodiment, the first gate electrode G1 and the second gate electrode G2 may be a bottom gate type in which the first gate electrode G1 and the second gate electrode G2 may be respectively disposed below the first semiconductor layer Act1 and the second semiconductor layer Act2.

The storage capacitor Cst may include a first storage electrode CE1 and a second storage electrode CE2 overlapping each other. The first storage electrode CE1 and the second storage electrode CE2 may each include a low-resistance conductive material including at least one of molybdenum (Mo), aluminum (Al), copper (Cu), or titanium (Ti).

The storage capacitor Cst may overlap the first thin-film transistor T1, and the first thin-film transistor T1 may be a driving thin-film transistor. FIG. 4 illustrates a case in which the storage capacitor Cst may be disposed to overlap the first thin-film transistor T1 so that the first storage electrode CE1 may be the first gate electrode G1 of the first thin-film transistor T1, but embodiments are not limited thereto. In another embodiment, the storage capacitor Cst may be disposed not to overlap the first thin-film transistor T1.

A buffer layer 110 may be disposed between the substrate 100 and the first and second thin-film transistors T1 and T2. The buffer layer 110 may include an inorganic insulating material. For example, the buffer layer 110 may be a single film or a multi-layered film including at least one of silicon oxynitride (SiON), silicon oxide ($SiO_x$), or silicon nitride ($SiN_x$).

The gate insulating layer 120 may be disposed between the first and second gate electrodes G1 and G2 and the first and second semiconductor layers Act1 and Act2. The gate insulating layer 120 may include an inorganic insulating material. For example, the gate insulating layer 120 may be a single film or a multi-layered film including at least one of silicon oxynitride (SiON), silicon oxide ($SiO_x$), or silicon nitride ($SiN_x$).

The first and second thin-film transistors T1 and T2 may be covered with first and second interlayer insulating layers 131 and 132. The first interlayer insulating layer 131 may be disposed on (e.g., directly on) the first and second thin-film transistors T1 and T2 and/or on (e.g., directly on) the first storage electrode CE1. The second interlayer insulating layer 132 may be disposed on the second storage electrode CE2. The first and second interlayer insulating layers 131 and 132 may each be a single film or a multi-layered film including at least one of silicon oxynitride (SiON), silicon oxide ($SiO_x$), or silicon nitride ($SiN_x$). In one embodiment, the first interlayer insulating layer 131 may be a single film of silicon nitride ($SiN_x$), and the second interlayer insulating layer 132 may be a multi-layered film of silicon nitride ($SiN_x$) and silicon oxide ($SiO_x$).

A data line DL may be disposed on the second interlayer insulating layer 132. The data line DL may be electrically connected to the first thin-film transistor T1 and configured to provide a data signal. The data line DL may be a single film or a multi-layered film including at least one of aluminum (Al), copper (Cu), titanium (Ti), or any alloy thereof. In one embodiment, the data line DL may be a three-layer film of Ti/Al/Ti.

The driving voltage supply line PL may be configured to provide a driving signal to the second thin-film transistor T2. The driving voltage supply line PL may be disposed on a layer that may be different from that of the data line DL. As used herein, the expression "A and B may be disposed on different layers" refers to a case in which at least one insulating layer may be disposed between A and B so that one of A and B may be disposed under the at least one insulating layer and another thereof may be disposed above the at least one insulating layer. A first planarization insulating layer 141 may be disposed between the driving voltage supply line PL and the data line DL.

The driving voltage supply line PL may be a single film or a multi-layered film including at least one of aluminum (Al), copper (Cu), titanium (Ti), or any alloy thereof. In one embodiment, the driving voltage supply line PL may be a three-layer film of Ti/Al/Ti. A configuration in which the driving voltage supply line PL may be disposed only on the first planarization insulating layer 141 is illustrated in FIG. 4, but embodiments are not limited thereto. In another embodiment, the driving voltage supply line PL may be connected to a lower additional voltage line (not illustrated), which may be formed together with the data line DL, through a through hole (not illustrated), which may be formed in the first planarization insulating layer 141, thereby reducing resistance.

The second planarization insulating layer 142 may cover the driving voltage supply line PL. The first and second planarization insulating layers 141 and 142 may each include an organic material. The organic material may include a general-purpose polymer (imide-based polymer, polymethylmethacrylate (PMMA), polystyrene (PS), or the like), a polymer derivative having a phenol-based group, an acryl-based polymer, arylether-based polymer, an amide-based polymer, a fluorine-based polymer, a p-xylene-based polymer, a vinyl alcohol-based polymer, and any blend thereof.

The light-emitting device 300 may be disposed on the second planarization insulating layer 142. The light-emitting device 300 may include a pixel electrode 310, a common electrode 330, and an intermediate layer 320 disposed between the pixel electrode 310 and the common electrode 330 and may include an emission layer.

A pixel defining layer 150 may be disposed on the pixel electrode 310. Since the pixel defining layer 150 may include an opening corresponding to each pixel (e.g., an opening exposing a central portion of at least the pixel electrode 310), the pixel defining layer 150 may define a pixel. The pixel defining layer 150 may increase a distance between an edge of the pixel electrode 310 and the common electrode 330, thereby preventing arcs or the like from occurring therebetween. The pixel defining layer 150 may include, for example, an organic material such as polyimide (PI) or hexamethyldisiloxane (HMDSO).

The pixel electrode 310 may be electrically connected to a pixel circuit, for example, the pixel circuit PC of FIG. 3 including the first and second thin-film transistors T1 and T2 and the storage capacitor Cst, through first and second connection metals CM1 and CM2.

The intermediate layer 320 may include a low-molecular-weight material or a high-molecular-weight material. In case that the intermediate layer 320 includes a low-molecular-weight material, the intermediate layer 320 may have a single-layered structure or a multi-layered structure including a hole injection layer (HIL), a hole transport layer (HTL), an emission layer (EML), an electron transport layer (ETL), and an electron injection layer (EIL). The intermediate layer 320 may include various organic materials, for example, copper phthalocyanine (CuPc), N,N'-di(naphthalene-1-yl)-N,N'-diphenyl-benzidine (NPB), tris-8-hydroxyquinoline aluminum (Alq3), or a combination thereof. These layers may be formed by using vacuum deposition.

In case that the intermediate layer 320 includes a high-molecular-weight material, the intermediate layer 320 may have a structure including a hole transport layer (HTL) and an emission layer (EML). The HTL may include poly(3,4-ethylenedioxythiophene) (PEDOT), and the EML may include a high-molecular-weight material such as a polyphenylenevinylene (PPV)-based polymer and a polyfluorene-based polymer. The structure of the intermediate layer 320 is not limited thereto, and the intermediate layer 320 may have various structures. For example, the intermediate layer 320 may include an integrated layer over the pixel electrodes 310, or may include layers patterned corresponding to the respective pixel electrodes 310.

The common electrode 330 may be disposed to cover the display area DA. For example, the common electrode 330 may be integrally formed so as to cover multiple light-emitting devices 300.

An encapsulation layer 500 may be disposed on the common electrode 330. The encapsulation layer 500 may protect the organic light-emitting device from external moisture or oxygen. To this end, the encapsulation layer 500 may have a shape extending to not only the display area DA in which the light-emitting device 300 may be disposed, but also the non-display area PA outside the display area DA. The encapsulation layer 500 may include a first inorganic encapsulation layer 510, an organic encapsulation layer 520, and a second inorganic encapsulation layer 530, which may be sequentially stacked.

The first inorganic encapsulation layer 510 may be formed on the common electrode 330 and may include silicon oxide, silicon nitride, and/or silicon oxynitride. The first inorganic encapsulation layer 510 may be formed along the underlying structure thereof.

Since the organic encapsulation layer 520 may be disposed on the first inorganic encapsulation layer 510 and may have a sufficient thickness, the upper surface of the organic encapsulation layer 520 may be substantially flat. The organic encapsulation layer 520 may include one or more materials selected from polyethylene terephthalate, polyethylene naphthalate, polycarbonate, polyimide, polyethylene sulfonate, polyoxymethylene, polyarylate, and hexamethyldisiloxane.

The second inorganic encapsulation layer 530 may cover the organic encapsulation layer 520 and may include silicon oxide, silicon nitride, and/or silicon oxynitride. The first inorganic encapsulation layer 510 and the second inorganic encapsulation layer 530 may each have a larger area than that of the organic encapsulation layer 520 and may each be in contact with each other outside the organic encapsulation layer 520. For example, the first inorganic encapsulation layer 510 and the second inorganic encapsulation layer 530 may prevent the organic encapsulation layer 520 from being exposed to the outside.

As described above, the encapsulation layer 500 may include the first inorganic encapsulation layer 510, the organic encapsulation layer 520, and the second inorganic encapsulation layer 530. Accordingly, even in case that cracks may occur in the encapsulation layer 500, such a multi-layered structure may prevent these cracks from being connected to each other between the first inorganic encapsulation layer 510 and the organic encapsulation layer 520 or between the organic encapsulation layer 520 and the second inorganic encapsulation layer 530. Consequently, it may be possible to prevent or minimize the formation of a passage through which external moisture or oxygen may penetrate into the display area DA of FIG. 1.

Figure 5:
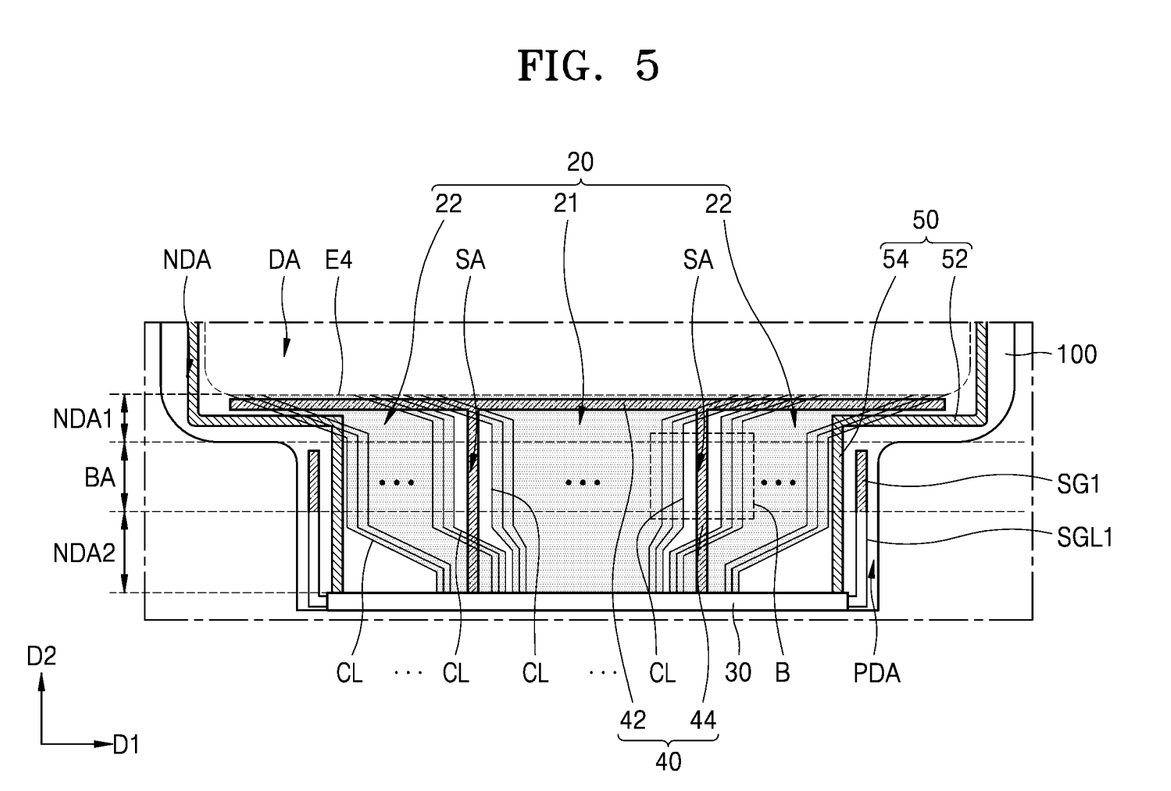
FIG. 5 is an enlarged schematic plan view schematically illustrating region A of FIG. 1.
Figure 6:
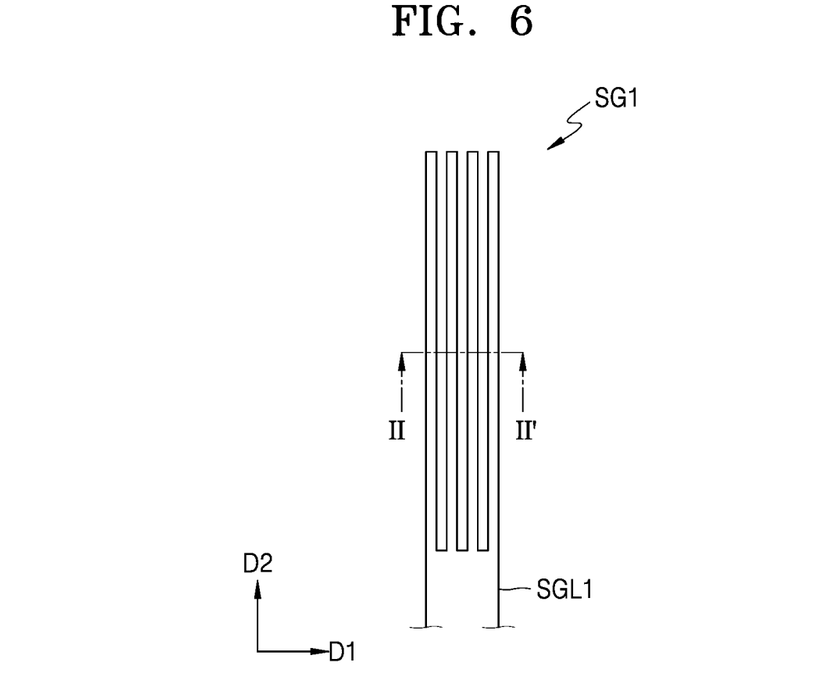
FIG. 6 is a schematic plan view schematically illustrating a first strain gauge of FIG. 5.
Figure 7:
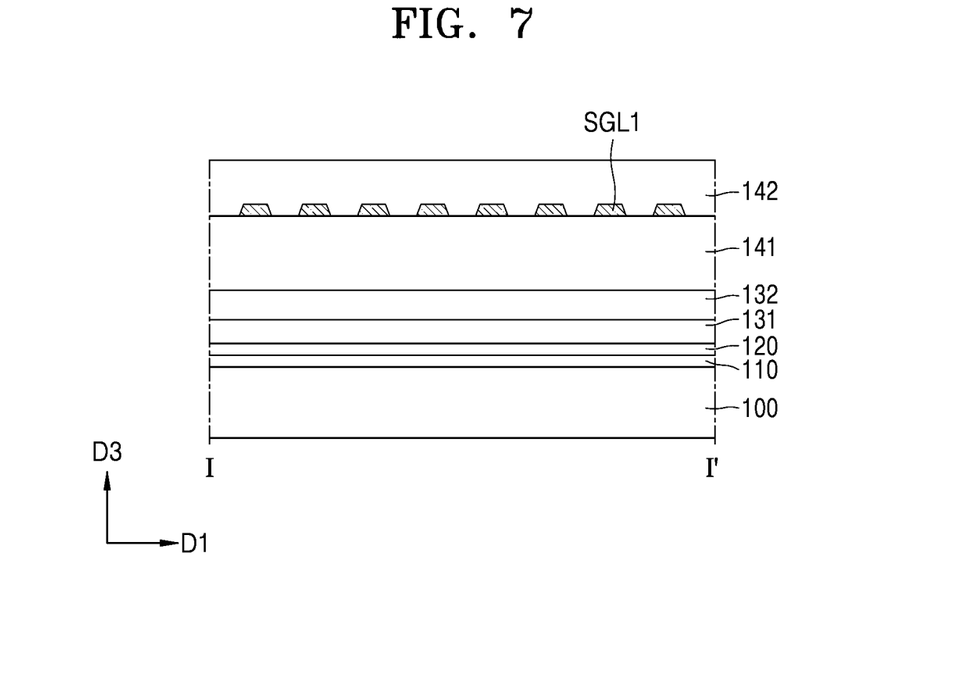
FIG. 7 is a schematic cross-sectional view taken along line II-II' of FIG. 6, according to an embodiment.

FIG. 5 is an enlarged schematic plan view schematically illustrating region A of FIG. 1, FIG. 6 is a schematic plan view schematically illustrating a first strain gauge of FIG. 5, and FIG. 7 is a schematic cross-sectional view taken along line II-II' of FIG. 6, according to an embodiment.

Referring to FIG. 5, a first voltage line 40, a second voltage line 50, a fan-out portion 20, and the like may be disposed in the non-display area NDA between the display area DA and the pad area PDA of the substrate 100.

The first voltage line 40 may be a first power supply voltage (ELVDD) line, and the second voltage line 50 may be a second power supply voltage (ELVSS) line. The first voltage line 40 may be connected to the driving voltage supply line PL of FIG. 4, and the second voltage line 50 may be connected to the common electrode 330 of FIG. 4 directly or through another line.

The first voltage line 40 may include a first main voltage line 42 extending from one side of the display area DA, for example, the outside of the fourth edge E4, in the first direction D1, and a first connection portion 44 protruding from the first main voltage line 42 in the second direction D2. The first connection portion 44 may be provided in plurality and may be connected to the driving circuit 30 disposed in the pad area PDA across the bending area BA.

The second voltage line 50 may surround the remaining edges of the display area DA except for one edge of the display area DA adjacent to the first voltage line 40. The second voltage line 50 may include a second main voltage line 52 corresponding to both end portions of the first main voltage line 42 and the remaining areas of the display area DA, and a second connection portion 54 protruding from the end portion of the second main voltage line 52 in the second direction D2. The second connection portion 54 may be connected to the driving circuit 30.

The fan-out portion 20 includes conductive lines CL. The conductive lines CL may be electrically connected to the data lines DL of FIG. 4 and configured to transfer a data signal applied from the driving circuit 30 to the pixel circuit PC of FIG. 3.

Hereinafter, for convenience of description, as illustrated in FIG. 5, an area between the bending area BA and the display area DA in the non-display area NDA of the substrate 100 may be defined as a first non-display area NDA1, and an area on a side opposite to the first non-display area NDA1 with respect to the bending area BA may be defined as a second non-display area NDA2. For example, the second non-display area NDA2 may be an area that may not be recognized from the front side in case that the bending area BA may be bent, and may be an area between the bending area BA and the driving circuit 30.

The conductive lines CL may be disposed so as to sequentially pass through the first non-display area NDA1, the bending area BA, and the second non-display area NDA2. A length of the pad area PDA may be less than a length of one side of the display area DA adjacent to the pad area PDA. Accordingly, an interval between the conductive lines CL may narrow from the display area DA to the pad area PDA. The bending area BA may be an area in which stress may be concentrated. Thus, in order to minimize damage to the conductive lines CL during bending, the conductive lines CL may extend in the bending area BA in a direction parallel to the bending direction. Therefore, the conductive lines CL may be bent between the first non-display area NDA1 and the second non-display area NDA2.

The fan-out portion 20 may be divided into areas spaced apart from each other in at least the bending area BA. For example, as illustrated in FIG. 5, the fan-out portion 20 may include two second fan-out portions 22 respectively disposed at both sides of a first fan-out portion 21 with respect to the first fan-out portion 21 disposed in the center. However, embodiments are not limited thereto, and the fan-out portion 20 may be divided into four or more areas.

In the bending area BA, a first connection portion 44 may be disposed in a spacing area SA between the first fan-out portion 21 and the second fan-out portion 22. As will be described below, the first connection portion 44, a second connection portion 54, and the conductive lines CL may be disposed on the same layer in the bending area BA, so as to prevent a short circuit therebetween. As the first connection portion 44 may be disposed in the spacing area SA, current distribution through the first main voltage line 42 may be more uniform over the entire display area DA and heat generation may be reduced, as compared with a case in which the first connection portion 44 may be disposed outside the fan-out portion 20. The first connection portion 44 may be illustrated in FIG. 5 as being disposed in the spacing area SA, but the second connection portion 54 may be disposed in the spacing area SA, or the first connection portion 44 and the second connection portion 54 may be disposed in the spacing area SA.

A pair of first strain gauges SG1 may be disposed at both ends of the bending area BA, respectively. The first strain gauge SG1 may detect stress applied to the bending area BA in case that the bending area BA may be bent. The first strain gauge SG1 may include a first resistance line SGL1 reciprocating multiple of times to form a bent portion and may be connected to the driving circuit 30. The resistance of the first resistance line SGL1 may be changed according to the degree of bending of the bending area BA. The first strain gauge SG1 senses the resistance change to detect stress applied to the bending area BA, and the driving circuit 30 may measure the stress applied to the bending area BA.

The first resistance line SGL1 may be disposed on the first planarization insulating layer 141 and may be covered with the second planarization insulating layer 142. For example, the first resistance line SGL1 may be formed together with the driving voltage supply line PL of FIG. 4 to have a same structure as the driving voltage supply line PL.

Figure 8:
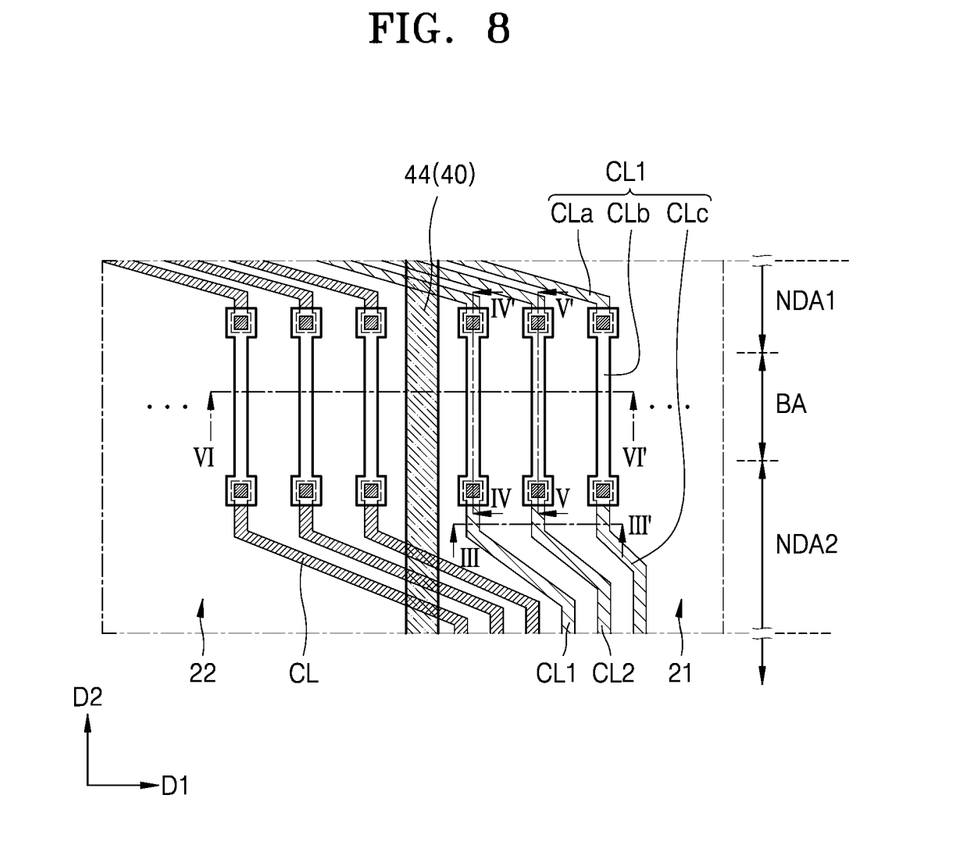
FIG. 8 is an enlarged schematic plan view schematically illustrating region B of FIG. 5.
Figure 9:
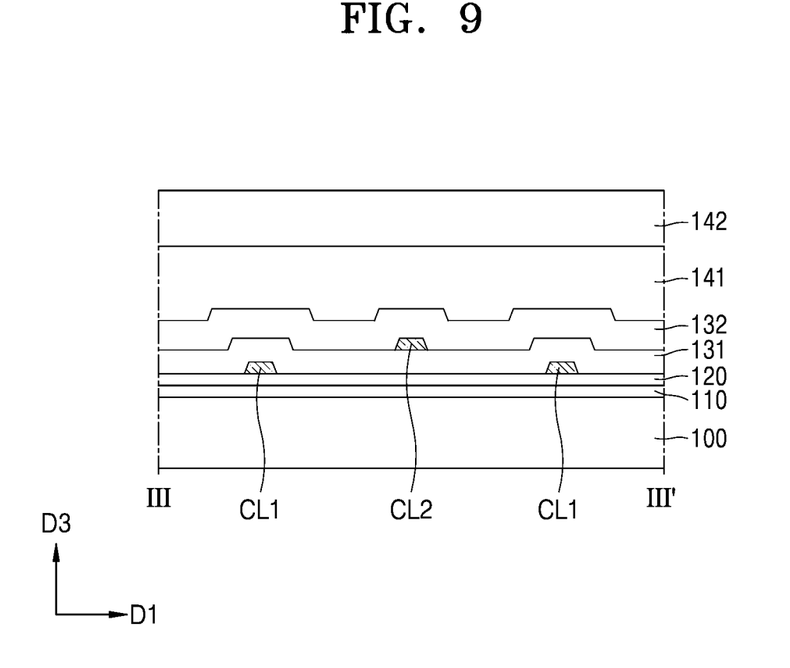
FIG. 9 is a schematic cross-sectional view taken along line III-Ill' of FIG. 8, according to an embodiment.
Figure 10:
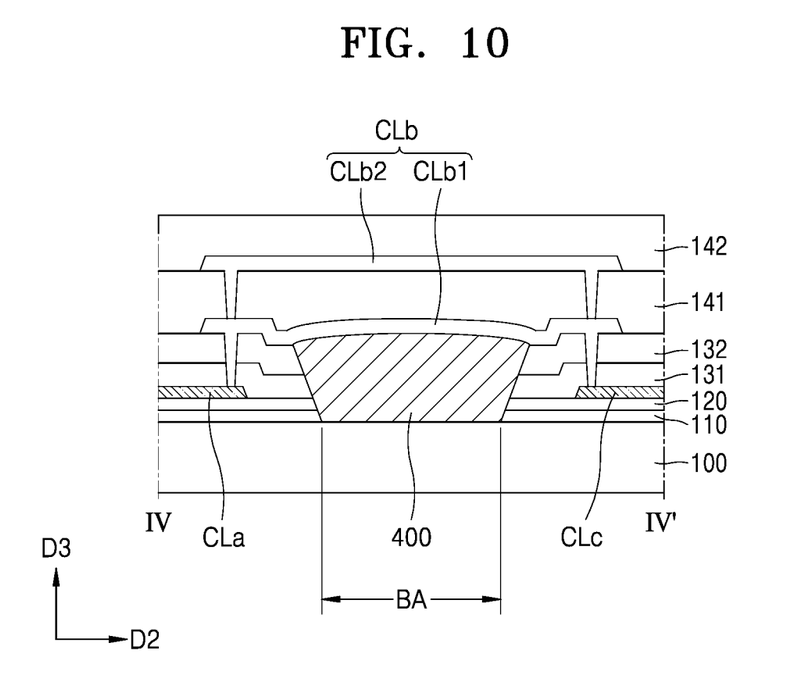
FIG. 10 is a schematic cross-sectional view taken along line IV-IV' of FIG. 8, according to an embodiment.
Figure 11:
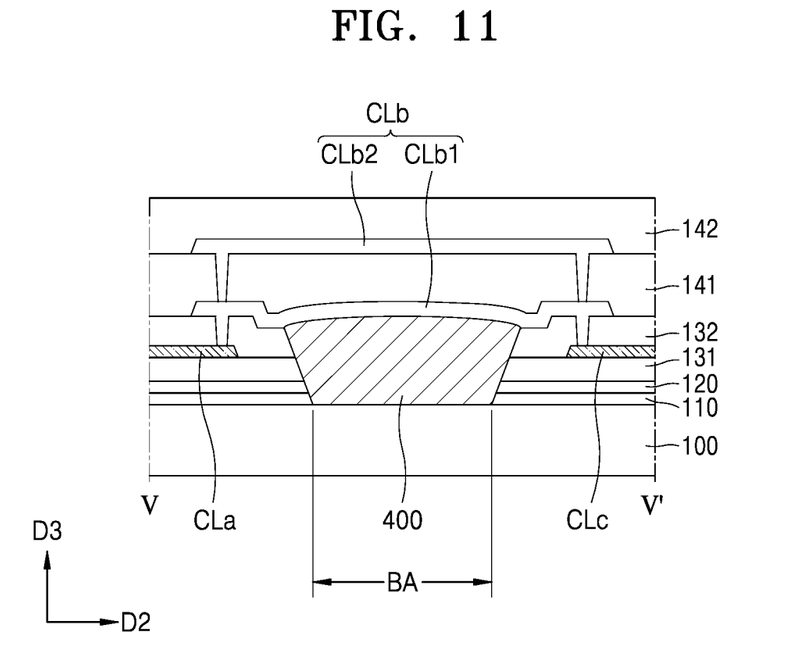
FIG. 11 is a schematic cross-sectional view taken along line V-V of FIG. 8, according to an embodiment.
Figure 12:
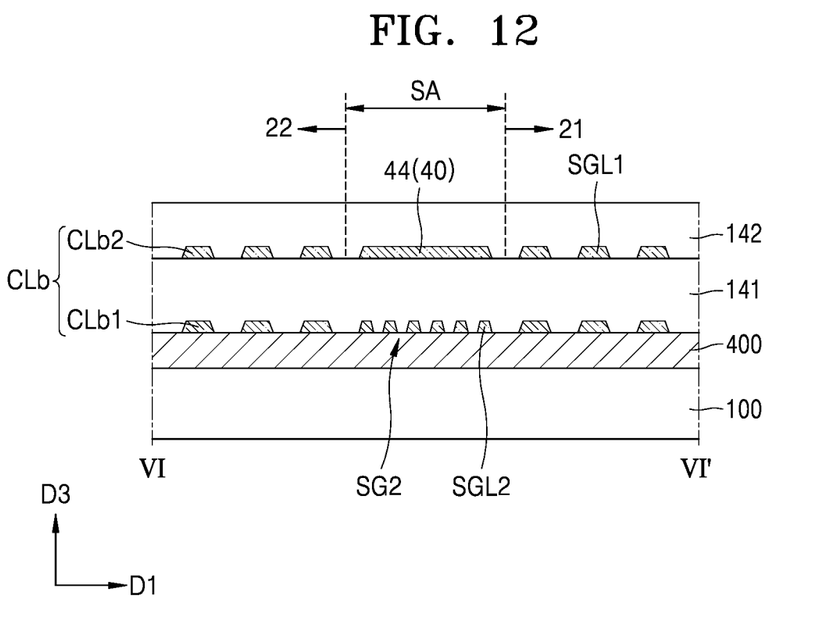
FIG. 12 is a schematic cross-sectional view taken along line VI-VI' of FIG. 8, according to an embodiment.

FIG. 8 is an enlarged schematic plan view schematically illustrating region B of FIG. 5, FIG. 9 is a schematic cross-sectional view taken along line III-III' of FIG. 8, FIG. 10 is a schematic cross-sectional view taken along line IV-IV' of FIG. 8, FIG. 11 is a schematic cross-sectional view taken along line V-V of FIG. 8, and FIG. 12 is a schematic cross-sectional view taken along line VI-VI' of FIG. 8, according to an embodiment.

Referring to FIGS. 8 to 11, the first fan-out portion 21 and the second fan-out portion 22 may each include conductive lines CL. As the resolution of the display apparatus 1 of FIG. 1 increases, the number of necessary conductive lines CL may increase to decrease the interval between the conductive lines CL. As a result, the risk of a short circuit between the conductive lines CL may increase. Accordingly, the conductive lines CL may solve the above-described limitation by including the first conductive lines CL1 and the second conductive lines CL2 disposed at different heights. The terms "different heights" may mean that the distances from the substrate 100 may be different.

As illustrated in FIG. 9, the first conductive lines CL1 may be disposed on the gate insulating layer 120, the second conductive lines CL2 may be disposed on the first interlayer insulating layer 131, and the first conductive lines CL1 and the second conductive lines CL2 may be alternately disposed. Therefore, even in case that the distance between the first conductive line CL1 and the second conductive line CL2 may be reduced as seen in a plan view, a short circuit between the first conductive line CL1 and the second conductive line CL2 may be prevented from occurring.

More specifically, the conductive lines CL may each include a first area CLa disposed in the first non-display area NDA1, a second area CLc disposed in the second non-display area NDA2, and a connection conductive layer CLb configured to connect the first area CLa to the second area CLc. That the heights of the first conductive line CL1 and the second conductive line CL2 adjacent to each other as described above may be different means that the first areas CLa of the first conductive line CL1 and the second conductive line CL2 may be disposed on different layers, and the second areas CLc of the first conductive line CL1 and the second conductive line CL2 may be disposed on different layers. In contrast, the connection conductive layer CLb crossing the bending area BA may be at the same height in the first conductive line CL1 and the second conductive line CL2.

For example, FIG. 10 illustrates the first conductive line CL1 that has the first area CLa and the second area CLc on the gate insulating layer 120 and connected by the connection conductive layer CLb, and FIG. 11 illustrates the second conductive line CL2 that has the first area CLa and the second area CLc on the first interlayer insulating layer 131 and connected by the connection conductive layer CLb.

The connection conductive layer CLb may be formed to be longer than the bending area BA, so that contact points thereof with the first area CLa and the second area CLc may be disposed in the first non-display area NDA1 and the second non-display area NDA2, respectively.

The connection conductive layers CLb may be connected in parallel to each other and may include a first connection conductive layer CLb1 and a second connection conductive layer CLb2 overlapping each other as seen in a plan view. Therefore, even in case that the first connection conductive layer CLb1 or the second connection conductive layer CLb2 may be damaged by the stress applied to the bending area BA, electrical disconnection between the first area CLa and the second area CLc may be prevented.

The first connection conductive layer CLb1 may be disposed on the second interlayer insulating layer 132, and the second connection conductive layer CLb2 may be disposed on the first planarization insulating layer 141. For example, the first connection conductive layer CLb1 may be formed together with the data line DL to have a same structure as the data line DL of FIG. 4, and the second connection conductive layer CLb2 may be formed together with the driving voltage supply line PL of FIG. 4 to have a same structure as the driving voltage supply line PL. The second connection conductive layer CLb2 may be disposed on the same layer as the first strain gauge SG1 of FIG. 5.

The connection conductive layer CLb may cross the bending area BA. As illustrated in FIG. 10, the bending area BA may be an area in which the buffer layer 110, the gate insulating layer 120, the first interlayer insulating layer 131, and the second interlayer insulating layer 132 on the substrate 100 may be removed (e.g., partially removed). Hereinafter, the buffer layer 110, the gate insulating layer 120, the first interlayer insulating layer 131, and the second interlayer insulating layer 132 may be collectively referred to as an "inorganic insulating layer." For example, the inorganic insulating layer stacked on the substrate 100 may be understood as including a groove at a position corresponding to the bending area BA. The inorganic insulating layer may be partially removed in the bending area BA, thereby facilitating bending in the bending area BA and preventing cracks or the like from occurring in the inorganic insulating layer during bending.

An organic layer 400 may be filled in an area in which the inorganic insulating layer may be removed. The organic layer 400 may extend from the bending area BA to the non-bending area adjacent to the bending area BA. The organic layer 400 may not only compensate for a height difference of the bending area BA in which the inorganic insulating layer may be removed, but also absorb stress generated by bending. Therefore, in order to transfer an electrical signal from the driving circuit 30 disposed in the pad area PDA to the display area DA, it may be possible to effectively minimize the concentration of stress generated during bending on the connection conductive layer CLb disposed on the bending area BA.

The organic layer 400 may include at least one material selected from acryl, methacryl, polyester, polyethylene, polypropylene, polyethylene terephthalate, polyethylene naphthalate, polycarbonate, polyimid, polyethylene sulfonate, polyoxymethylen, polyarylate, and hexamethyldisiloxane.

Although not illustrated in the drawings, a pixel defining layer 150 of FIG. 4 may be disposed on the second planarization insulating layer 142 in the bending area BA. A bending protection layer may be further disposed on the pixel defining layer 150 of FIG. 4, so that a stress neutral plane may be near the line in the bending area BA during bending.

Referring to FIGS. 8 and 12, the first connection portion 44 may be disposed between the first fan-out portion 21 and the second fan-out portion 22 in the bending area BA. The width of the first connection portion 44 may be greater than the width of the conductive line CL.

The first connection portion 44 may cross the bending area BA and may be on the first planarization insulating layer 141. The first connection portion 44 may be also disposed on the first planarization insulating layer 141 in the first non-display area NDA1 and the second non-display area NDA2. Therefore, since the first connection portion 44 may be disposed on the same layer as the second connection conductive layer CLb2 in the bending area BA, the first connection portion 44 may be spaced apart from the second connection conductive layer CLb2. However, since the first area CLa and the second area CLc may be on different layers than the first connection portion 44 in the first non-display area NDA1 and the second non-display area NDA2, the first connection portion 44 may be disposed to overlap the first area CLa and the second area CLc in the vertical direction.

In order to prevent electrical disconnection between the first area CLa and the second area CLc because the connection conductive layer CLb may be broken by the stress generated in the bending area BA, the connection conductive layer CLb may include the first connection conductive layer CLb1 and the second connection conductive layer CLb2 connected in parallel as described above. Since the width of the first connection portion 44 may be greater than the width of the connection conductive layer CLb, it may be less likely that disconnection may occur in the first connection portion 44, as compared with the connection conductive layer CLb. Therefore, the first connection portion 44 may be disposed only on the first planarization insulating layer 141.

A second strain gauge SG2 may be disposed at a position overlapping the first connection portion 44. The second strain gauge SG2 may be disposed on the same layer as the first connection conductive layer CLb1. The second strain gauge SG2 may have the same configuration as the first strain gauge SG1 of FIG. 6 described above. Therefore, the second strain gauge SG2 may include a second resistance line SGL2 reciprocating multiple times to form a bent portion and may be electrically connected to the driving circuit 30 of FIG. 5.

According to one or more embodiments, the first connection portion 44 may be disposed in the spacing area SA between the first fan-out portion 21 and the second fan-out portion 22. For example, since the first connection portion 44 may be disposed between the conductive lines CL, the first connection portion 44 may be disposed closer to the central portion of the bending area BA than in the related art. In case that the second strain gauge SG2 may be disposed to overlap the first connection portion 44 in the bending area BA, the stress applied to the bending area BA may be measured even near the central portion of the bending area BA, which may not be measured by the first strain gauge SG1 of FIG. 6. Therefore, the stress applied to the entire bending area BA may be determined more accurately.

For example, in case that an impact may be applied to the central portion of the bending area BA during the process of manufacturing the display apparatus 1 of FIG. 1, stress may be locally increased due to the impact in the central portion of the bending area BA. Thus, it may be highly likely that disconnection will occur in the connection conductive layer CLb. However, since the increase in such stress may be difficult for the first strain gauge SG1 of FIG. 6 to detect, it may be difficult to determine in advance a stress increase phenomenon before an actual failure occurs. However, according to one or more embodiments, the second strain gauge SG2 overlapping the first connection portion 44 in the bending area BA may more accurately determine the stress applied to the entire bending area BA. Therefore, whether there may be the possibility of damage to the display apparatus 1 of FIG. 1 may be determined in advance by determining whether the stress applied to the bending area BA reaches a threshold value of the connection conductive layers CLb, thereby improving the reliability of the display apparatus 1 in FIG. 1.

FIG. 12 illustrates an example in which the second strain gauge SG2 may be disposed at a position overlapping the first connection portion 44, but the second strain gauge SG2 may be disposed at a position overlapping the second connection portion 54 of FIG. 5. For example, the second strain gauge SG2 may be disposed to overlap at least one of the first connection portion 44 or the second connection portion 54 of FIG. 5.

According to one or more embodiments, it may be possible to accurately determine the stress generated in the bending area during the bending of the display apparatus and thus determine in advance whether the bending area may be damaged, thereby improving the reliability of the display apparatus.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims including any equivalents.

What is claimed is:

1. A display apparatus comprising:
    a substrate including a display area, a non-display area outside the display area, a pad area in the non-display area, and a bending area between the display area and the pad area;
    a first voltage line including;
        a first main voltage line to apply a first power supply voltage to the display area, the first main voltage line disposed between the display area and the bending area; and
        a first connection portion protruding from the first main voltage line, extending toward the pad area, and crossing the bending area;
    a fan-out portion disposed between the display area and the pad area on the substrate and comprising conductive lines that connect the display area to the pad area; and
    a strain gauge disposed in the bending area, wherein
    the strain gauge overlaps the first connection portion of the first voltage line in the bending area in plan view.

2. The display apparatus of claim 1, wherein the conductive lines each comprise:
    a first area between the display area and the bending area;
    a second area between the bending area and the pad area; and
    a connection conductive layer that electrically connects the first area to the second area and crossing the bending area, wherein
    the connection conductive layer comprises a first connection conductive layer and a second connection conductive layer connected in parallel to each other and overlapping each other in plan view.

3. The display apparatus of claim 2, wherein
    the second connection conductive layer is disposed above the first connection conductive layer,
    the second connection conductive layer and the first connection portion are disposed on a same layer, and
    the first connection conductive layer and the strain gauge are disposed on a same layer.

4. The display apparatus of claim 3, wherein
    the first area and the second area are on a same layer, and
    the first connection portion is disposed on a different layer than the first area.

5. The display apparatus of claim 2, wherein
    the conductive lines comprise a first conductive line and a second conductive line, which are adjacent to each other, and
    the first area of the first conductive line and the second area of the second conductive line are disposed on different layers.

6. The display apparatus of claim 1, wherein
    the fan-out portion comprises a first fan-out portion and a second fan-out portion spaced apart from each other in the bending area, and
    the first connection portion is disposed in a spacing area between the first fan-out portion and the second fan-out portion in the bending area.

7. The display apparatus of claim 1, wherein the strain gauge comprises a resistance line having bending portions that is electrically connected to a driving circuit disposed in the pad area.

8. The display apparatus of claim 1, further comprising a second voltage line that applies a voltage different from a voltage of the first voltage line to the display area, wherein
    the second voltage line comprises a second connection portion extending in a direction parallel to the first connection portion,
    the second connection portion and the first connection portion are disposed on a same layer, and
    the strain gauge further overlaps the second connection portion in the bending area in plan view.

9. The display apparatus of claim 1, wherein the first connection portion is disposed between the conductive lines.

10. The display apparatus of claim 1, further comprising an inorganic insulating layer disposed on the substrate, wherein
    the inorganic insulating layer comprises a groove at a position corresponding to the bending area,
    an organic layer is disposed in the groove, and
    the first connection portion and the conductive lines are disposed on the organic layer in the bending area.

11. A display apparatus comprising:
a substrate including a display area, a non-display area outside the display area, a pad area in the non-display area, and a bending area between the display area and the pad area;
a pair of first strain gauges disposed at sides of the bending area;
a fan-out portion disposed between the display area and the pad area on the substrate and comprising conductive lines that connect the display area to the pad area;
a first voltage line having;
  a first main voltage line to apply a first power supply voltage to the display area, the first main voltage line disposed between the display area and the bending area; and
  a first connection portion protruding from the first main voltage line, extending toward the pad area, and crossing the bending area;
a second voltage line that applies a second power supply voltage different from the first power supply voltage to the display area, wherein
  the second voltage line comprises a second connection portion extending in a direction parallel to the first connection portion of the first voltage line, and
  the second connection portion of the second voltage line and the first connection portion of the first voltage line are disposed on a same layer; and
a second strain gauge disposed in the bending area,
wherein the second strain gauge overlaps at least one of the first connection portion of the first voltage line or the second connection portion of the second voltage line in plan view in the bending area.

12. The display apparatus of claim 11, wherein
the fan-out portion comprises a first fan-out portion and a second fan-out portion spaced apart from each other in the bending area, and
the first connection portion is disposed in a spacing area between the first fan-out portion and the second fan-out portion in the bending area.

13. The display apparatus of claim 11, wherein the conductive lines each comprise:
a first area between the display area and the bending area;
a second area between the bending area and the pad area; and
a connection conductive layer that electrically connects the first area to the second area and crossing the bending area, wherein
the connection conductive layer comprises a first connection conductive layer and a second connection conductive layer connected in parallel to each other and overlapping each other in plan view.

14. The display apparatus of claim 13, wherein
the second connection conductive layer is disposed above the first connection conductive layer,
the first connection portion, the second connection portion, the pair of the first strain gauges, and the second connection conductive layer are disposed on a same layer, and
the second strain gauge and the first connection conductive layer are disposed on a same layer.

15. The display apparatus of claim 14, wherein
pixel circuits, light-emitting devices electrically connected to the pixel circuits, and data lines electrically connected to the pixel circuits are disposed in the display area,
the conductive lines are electrically connected to the data lines and transfer an electrical signal from a driving circuit disposed in the pad area to the data lines, and
the first connection conductive layer and the data lines are disposed on a same layer.

16. The display apparatus of claim 15, further comprising driving voltage supply lines disposed in the display area, wherein
the driving voltage supply lines provide a driving signal to the pixel circuits, and
the second connection conductive layer and the driving voltage supply lines are disposed on a same layer.

17. The display apparatus of claim 15, wherein
the pixel circuits each comprise a storage capacitor comprising a first storage electrode and a second storage electrode, and
the first area, the second area, and either the first storage electrode or the second storage electrode are disposed on a same layer.

18. The display apparatus of claim 13, wherein
the first area and the second area are disposed on a same layer, and
the first connection portion and the second connection portion are disposed on a different layer than the first area.

19. The display apparatus of claim 18, wherein
the conductive lines comprise a first conductive line and a second conductive line, which are adjacent to each other, and
the first area of the first conductive line and the second area of the second conductive line are disposed on different layers.

20. The display apparatus of claim 11, further comprising an inorganic insulating layer disposed on the substrate, wherein
the inorganic insulating layer comprises a groove at a position corresponding to the bending area,
an organic layer is disposed in the groove, and
the first connection portion and the conductive lines are disposed on the organic layer in the bending area.

* * * * *